United States Patent
Lee et al.

(10) Patent No.: US 11,283,030 B2
(45) Date of Patent: Mar. 22, 2022

(54) LIGHT-EMITTING COMPOUND

(71) Applicant: Sumitomo Chemical Company Limited, Tokyo (JP)

(72) Inventors: James Lee, Godmanchester (GB); Martin Humphries, Godmanchester (GB); William Tarran, Godmanchester (GB); Nazrul Islam, Godmanchester (GB)

(73) Assignee: Sumitomo Chemical Company Limited, Tokyo (JP)

( * ) Notice: Subject to any disclaimer, the term of this patent is extended or adjusted under 35 U.S.C. 154(b) by 521 days.

(21) Appl. No.: 16/035,361

(22) Filed: Jul. 13, 2018

(65) Prior Publication Data

US 2019/0016739 A1 Jan. 17, 2019

(30) Foreign Application Priority Data

Jul. 14, 2017 (GB) .................................. 1711386

(51) Int. Cl.
| | | |
|---|---|---|
| *H01L 51/54* | (2006.01) | |
| *C09K 11/06* | (2006.01) | |
| *C07F 15/00* | (2006.01) | |
| *H01L 51/00* | (2006.01) | |
| *H01L 51/50* | (2006.01) | |

(52) U.S. Cl.
CPC ...... *H01L 51/0085* (2013.01); *C07F 15/0033* (2013.01); *C09K 11/06* (2013.01); *C09K 2211/185* (2013.01); *H01L 51/5016* (2013.01)

(58) Field of Classification Search
None
See application file for complete search history.

(56) References Cited

U.S. PATENT DOCUMENTS

| | | | | |
|---|---|---|---|---|
| 2002/0197511 A1* | 12/2002 | D'Andrade | ......... | H01L 51/5036 428/690 |
| 2005/0085654 A1* | 4/2005 | Takiguchi | .............. | C09K 11/06 556/136 |
| 2016/0254460 A1* | 9/2016 | Lin | ..................... | C07F 15/0033 257/40 |

FOREIGN PATENT DOCUMENTS

| | | | |
|---|---|---|---|
| EP | 2 882 766 | A1 | 2/2014 |
| EP | 3 205 658 | A1 | 8/2017 |

OTHER PUBLICATIONS

Zhou et al., "Efficient Red Electroluminescent Devices with Sterically Hindered Phosphorescent Platinum(II) Schiff Base Complexes and Iridium Complex Codopant", Chemistry an Asian Journal (2014) vol. 9, pp. 2984-2994. (Year: 2014).*
GB1711386.1, dated Apr. 16, 2018, Combined Search and Examination Report.
Combined Search and Examination Report for British Application No. 1711386.1, dated Apr. 16, 2018.
Tomás-Mendivil et al., Bicyclic (alkyl)(amino)carbenes (BICAACs): stable carbenes more ambiphilic than CAACs. J Am Chem Soc. 2017;139:7753-6.

* cited by examiner

*Primary Examiner* — Dylan C Kershner
(74) *Attorney, Agent, or Firm* — Wolf, Greenfield & Sacks, P.C.

(57) ABSTRACT

A phosphorescent compound of formula (I):

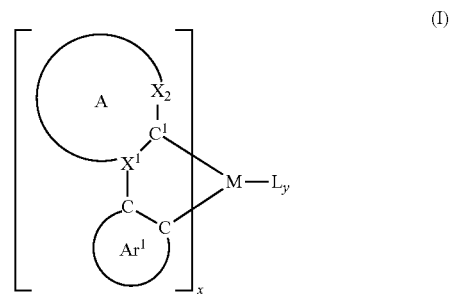

wherein: M is a transition metal; $C^1$ is a carbon atom forming a metal-carbene bond with M; A is a saturated bridged bicyclic or saturated bridged tricyclic group consisting of one nitrogen atom and 6-12 carbon atoms; either: (i) $X^1$ is a bridgehead carbon atom of the bridged bicyclic or bridged tricyclic group and $X^2$ is $NR^1$ wherein $R^1$ is a substituent, or (ii) $X^1$ is N and $X^2$ is a bridgehead group of formula $CR^6$ wherein $R^6$ is H or a substituent; $Ar^1$ is a $C_{6-20}$ aromatic group or a 5-20 membered heteroaromatic group; L in each occurrence is independently a mono- or polydentate ligand other than a ligand of formula A-$Ar^1$; x is at least 1; and y is 0 or a positive integer. The compound of formula (I) may be used as a blue light-emitting material in a white organic light-emitting device.

21 Claims, 1 Drawing Sheet

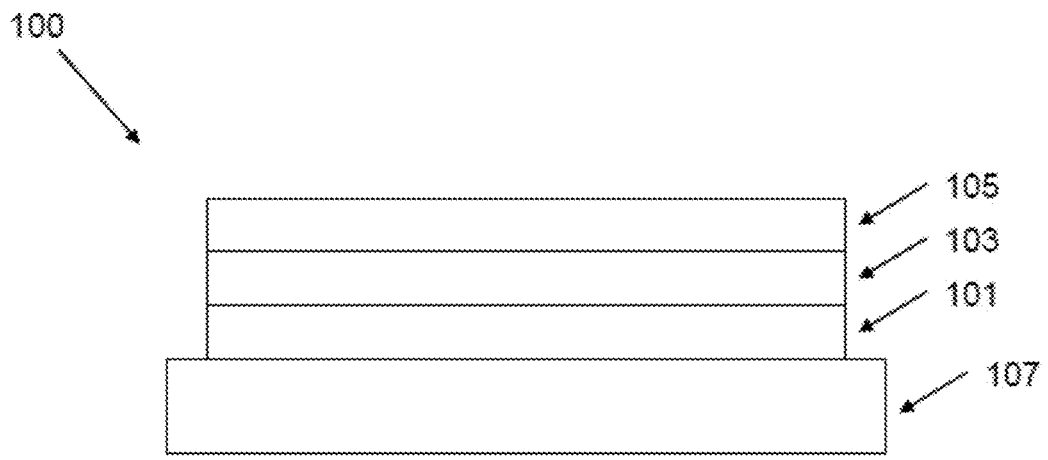

LIGHT-EMITTING COMPOUND

RELATED APPLICATIONS

This application claims foreign priority benefits under 35 U.S.C. § 119(a)-(d) or 35 U.S.C. § 365(b) of British application number 1711386.1, filed Jul. 14, 2017, the entirety of which is incorporated herein.

FIELD OF THE INVENTION

The present invention relates to phosphorescent light-emitting compounds; compositions, formulations and light-emitting devices comprising said light-emitting compounds; and methods of making said light-emitting devices.

BACKGROUND OF THE INVENTION

Electronic devices containing active organic materials include devices such as organic light emitting diodes (OLEDs), organic photoresponsive devices (in particular organic photovoltaic devices and organic photosensors), organic transistors and memory array devices. Devices containing active organic materials offer benefits such as low weight, low power consumption and flexibility. Moreover, use of soluble organic materials allows use of solution processing in device manufacture, for example inkjet printing or spin-coating.

An OLED may comprise a substrate carrying an anode, a cathode and one or more organic light-emitting layers between the anode and cathode.

Holes are injected into the device through the anode and electrons are injected through the cathode during operation of the device. Holes in the highest occupied molecular orbital (HOMO) and electrons in the lowest unoccupied molecular orbital (LUMO) of a light-emitting material combine to form an exciton that releases its energy as light.

Suitable light-emitting materials include small molecule, polymeric and dendrimeric materials. Suitable light-emitting polymers include poly(arylene vinylenes) such as poly (p-phenylene vinylenes) and polyarylenes such as polyfluorenes.

A light emitting layer may comprise a semiconducting host material and a light-emitting dopant wherein energy is transferred from the host material to the light-emitting dopant. For example, J. Appl. Phys. 65, 3610, 1989 discloses a host material doped with a fluorescent light-emitting dopant (that is, a light-emitting material in which light is emitted via decay of a singlet exciton).

Phosphorescent dopants are also known (that is, a light-emitting dopant in which light is emitted via decay of a triplet exciton).

Complexes containing a carbene ligand are disclosed in, for example, U.S. Pat. No. 8,258,297 and US 2015/171348.

Tomas-Mendevil et al, J. Am. Chem. Soc. 2017, 139, 7753-7756, "Bicyclic (Alkyl)(amino)carbenes (BICAACs): Stable Carbenes More Ambiphilic than CAACs" discloses bicyclic (alkyl)(amino)carbenes.

It is an object of the invention to provide blue phosphorescent light-emitting compounds suitable for use in an OLED.

SUMMARY OF THE INVENTION

In a first aspect the invention provides a phosphorescent compound of formula (I):

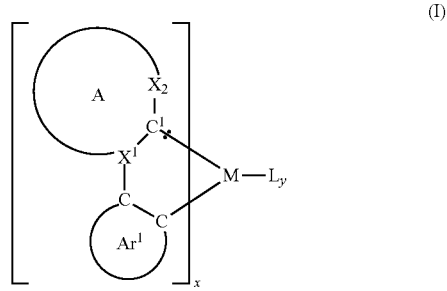

wherein:
M is a transition metal;
$C^1$ is a carbon atom forming a metal-carbene bond with M;
A is a saturated bridged bicyclic or saturated bridged tricyclic group consisting of one nitrogen atom and 6-12 carbon atoms wherein the carbon atoms are each independently unsubstituted or substituted with one or more substituents;
either: (i) $X^1$ is a bridgehead carbon atom of the bridged bicyclic or bridged tricyclic group and $X^2$ is $NR^1$ wherein $R^1$ is a substituent, or
(ii) $X^1$ is N and $X^2$ is a bridgehead group of formula $CR^6$ wherein $R^6$ is H or a substituent;
two substituents selected from substituents of the carbon atoms of A and substituent $R^1$ may be linked to form a ring;
$Ar^1$ is a $C_{6-20}$ aromatic group or a 5-20 membered heteroaromatic group which is unsubstituted or substituted with one or more substituents wherein a substituent of $Ar^1$ and a substituent of A may be linked to form a divalent linking group;
L in each occurrence is independently a mono- or polydentate ligand other than a ligand of formula $A-Ar^1$;
x is at least 1; and
y is 0 or a positive integer.

In a second aspect the invention provides a composition comprising a host material and a compound according to the first aspect.

In a third aspect the invention provides a formulation comprising a compound or composition according to the first or second aspect dissolved or dispersed in one or more solvents.

In a fourth aspect the invention provides an organic light-emitting device comprising an anode, a cathode and a light-emitting layer between the anode and cathode wherein the light-emitting layer comprises a compound or composition according to the first or second aspect.

In a fifth aspect the invention provides a method of forming an organic light-emitting device according to the fourth aspect, the method comprising the step of depositing the light-emitting layer over one of the anode and cathode, and depositing the other of the anode and cathode over the light-emitting layer.

DESCRIPTION OF THE DRAWINGS

The invention will now be described in more detail with reference to the FIGURE, in which:

The FIGURE illustrates an OLED according to an embodiment of the invention.

DETAILED DESCRIPTION OF THE INVENTION

Phosphorescent compounds as described herein have formula (I):

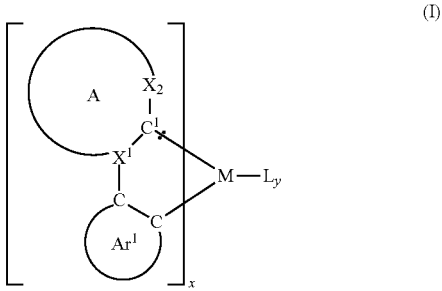

M is a transition metal, preferably a transition metal ion. Preferably, M is an atom or ion of Palladium, Rhenium, Osmium, Iridium, or Platinum. Preferably, M is $Ir^{3+}$.

$C^1$ is a carbon atom forming a metal-carbene bond with M.

$Ar^1$ is a $C_{6-20}$ aromatic group or a 5-20 membered heteroaromatic group which is unsubstituted or substituted with one or more substituents. $Ar^1$ is bound to M through an aromatic carbon atom.

Exemplary 5-20 membered heteroaromatic groups $Ar^1$ include dibenzofuran, dibenzothiophene, carbazole, and six membered heteroaromatics, pyridine, pyrimidine or pyrazine.

Exemplary $C_{6-20}$ aromatic groups include phenyl and fluorenyl.

Preferably, $Ar^1$ is phenyl.

$Ar^1$ is unsubstituted or substituted with one or more substituents. Substituents of $Ar^1$, if present, may be selected from substituents $R^3$ wherein each $R^3$ is independently selected from the group consisting of: F; CN; $NO_2$; $C_{1-20}$ alkyl wherein one or more non-adjacent, non-terminal C atoms of the alkyl group may be replaced with O, S, C=O and —COO—, and wherein one or more H atoms of the $C_{1-20}$ alkyl may be replaced with F; and —$(Ar^3)_z$ wherein $Ar^3$ in each occurrence is independently an aromatic or heteroaromatic group, preferably phenyl; z is at least 1, optionally 1, 2 or 3 and each $Ar^3$ is unsubstituted or substituted with one or more substituents.

Exemplary groups —$(Ar^3)_z$ are phenyl, biphenyl and 3,5-diphenylbenzene.

Preferably, each $R^3$ is selected from $C_{1-20}$ alkyl and —$(Ar^3)_z$ wherein each $Ar^3$ is independently phenyl which is unsubstituted or substituted with one or more $C_{1-12}$ alkyl groups.

Two substituents of $Ar^1$ may be linked to form a non-aromatic ring.

A and $Ar^1$ may be linked (in addition to the $X^1$—C bond) by a divalent linking group formed from a substituent of A and a substituent of $Ar^1$.

By "non-terminal carbon atom" as used herein is meant a carbon atom of an alkyl chain other than the carbon atom of a methyl group at the end of a linear alkyl (n-alkyl) group or the carbon atoms of methyl groups at the ends of a branched (secondary or tertiary) alkyl group.

Exemplary divalent linking groups linking A and $Ar^1$ include, without limitation, O, S, —$C(R^5)_2$—, —$C(R^5)_2$—$C(R^5)_2$—, —$C(R^5)$=$C(R^5)$—, a $C_{6-20}$ arylene group and a heteroarylene group wherein $R^5$ in each occurrence is independently H or a substituent, preferably H or a $C_{1-12}$ alkyl group. An arylene or heteroarylene linking group may be unsubstituted or substituted with one or more substituents, optionally one or more $C_{1-12}$ alkyl groups. A preferred linking group is unsubstituted or substituted 1,2-phenylene.

Ring A is a saturated bridged bicyclic or saturated bridged tricyclic group consisting of one nitrogen atom and 6-12 carbon atoms wherein the carbon atoms are each independently unsubstituted or substituted with one or more substituents and wherein two substituents of the carbon atoms may be linked to form a ring.

Either:

(i) $X^1$ is a bridgehead carbon atom of the bridged bicyclic or bridged tricyclic group and $X^2$ is $NR^1$ wherein $R^1$ is a substituent, or (ii) $X^1$ is N and $X^2$ is a bridgehead group of formula $CR^6$ wherein $R^6$ is H or a substituent.

In the case where $X^2$ is $NR^1$, $R^1$ may be selected from the group consisting of:

$C_{1-20}$ alkyl wherein one or more non-adjacent, non-terminal C atoms of the alkyl group may be replaced with O, S, C=O and —COO—, and wherein one or more H atoms of the $C_{1-20}$ alkyl may be replaced with F; and —$(Ar^2)$, wherein $Ar^2$ in each occurrence is independently an aromatic or heteroaromatic group, preferably phenyl; w is at least 1, optionally 1, 2 or 3 and each $Ar^2$ is unsubstituted or substituted with one or more substituents. The or each substituent of $Ar^2$, if present, may be a group of formula $R^2$ wherein each $R^2$ independently in each occurrence is selected from F, CN, $NO_2$ and $C_{1-20}$ alkyl wherein one or more non-adjacent, non-terminal C atoms of the alkyl group may be replaced with O, S, C=O and —COO—, and wherein one or more H atoms of the $C_{1-20}$ alkyl may be replaced with F.

Preferably, the or each substituent $R^1$ is a hydrocarbyl group, more preferably a group selected from $C_{1-20}$ alkyl; unsubstituted phenyl; and phenyl substituted with one or more $C_{1-12}$ alkyl groups.

Substituent $R^1$ may be linked with a substituent of a carbon atom of group A to form a ring.

In the case where $X^2$ is a bridgehead group of formula $CR^6$, the bridgehead carbon atom is preferably a tertiary carbon atom.

Preferably, each bridgehead carbon atom of compounds of formula (I) is a tertiary carbon atom.

$R^6$ is preferably a substituent, more preferably a substituent selected from $C_{1-12}$ alkyl and a $C_{6-20}$ aryl group, preferably phenyl, which may be unsubstituted or substituted with one or more substituents. Substituents of an aryl group $R^6$ may selected from substituents $R^2$ described above.

Preferably, A is a bridged bicyclic group. Preferably, A is a bicyclic group selected from an azahexane or azaheptane having a methylene or ethylene bridge.

The compound of formula (I) may have formula (Ia) or (Ib):

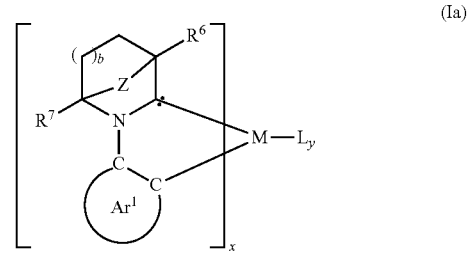

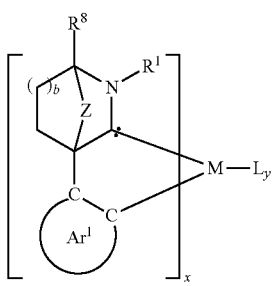

(Ib)

wherein Z is a group of formula —C(R$^4$)$_2$— or —C(R$^4$)$_2$—C(R$^4$)$_2$— wherein R$^4$ in each occurrence is H or a substituent; R$^6$, R$^7$ and R$^8$ are each independent H or a substituent; and b is 1 or 2.

Substituents R$^4$ may each independently be selected from C$_{1-12}$ alkyl. Preferably, each R$^4$ is H.

R$^7$ and R$^8$ are each preferably a substituent, more preferably a substituent selected from C$_{1-12}$ alkyl and a C$_{6-20}$ aryl group, preferably phenyl, which may be unsubstituted or substituted with one or more substituents. Substituents of an aryl group R$^7$ or R$^8$ may be selected from substituents R$^2$ described above.

Ligand A-Ar$^1$ of formula (Ia) is preferably selected from ligands of formulae:

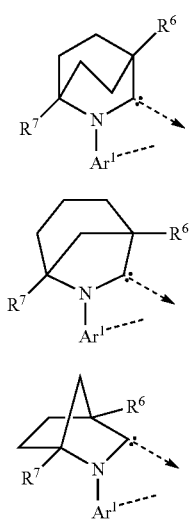

(1)

(2)

(3)

Ligand A-Ar$^1$ of formula (Ib) is preferably selected from ligands of formulae:

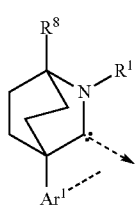

(4)

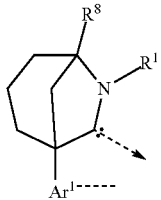

(5)

The ligand of formula (4) is particularly preferred.

For simplicity, the ring carbon atoms (other than the bridgehead carbon atoms) of group A of formulae (Ia), (Ib) and the carbon atoms of formulae (1)-(5) are shown without substituents however it will be understood that each secondary or tertiary ring carbon atom of ring structure A of formula (I) may be unsubstituted or substituted with one or more substituents.

Optionally, a bridgehead carbon atom of group A is substituted with a substituent selected from C$_{1-12}$ alkyl and a C$_{6-20}$ aryl group, preferably phenyl, which may be unsubstituted or substituted with one or more substituents, optionally one or more substituents selected from R$^2$ as described above.

Each non-bridgehead secondary or tertiary carbon atom of group A may be unsubstituted or substituted with one or two substituents, optionally one or two substituents R$^2$ as described above.

A substituent of group A may be linked to a substituent R$^3$ of Ar$^1$ to form a divalent linking group forming a ring fused to A and Ar$^1$.

Two substituents of group A may be linked to form a ring, optionally an aromatic ring, preferably a phenyl ring, fused to bicyclic or tricyclic group A.

Substituent A and a substituent of group A may be linked to form a ring, optionally an aromatic ring, fused to bicyclic or tricyclic group A.

Preferably, bicyclic or tricyclic group A is not fused to any further rings.

In the case where y is a positive integer, L in each occurrence is independently a mono- or poly-dentate ligand other than a ligand of formula A-Ar$^1$.

In some embodiments, x is 1 and y is 1 or 2.

In some embodiments, x is 2 and y is 1.

In some embodiments, x is 1, y is 1 and M is Pt$^{2+}$.

In some embodiments, one of x and y is 1, the other of x and y is 2 and M is Ir$^{3+}$.

L is preferably a bidentate ligand, preferably a ligand selected from: O,O cyclometallating ligands, optionally diketonates, optionally acac; N,O cyclometallating ligands, optionally picolinate; N,N cyclometallating ligands; and C,N cyclometallating ligands, optionally a ligand of formula Ar$^6$—Het wherein Ar$^6$ is a C$_{6-20}$ aryl group, optionally phenyl or naphthyl, and Het is a heteroaromatic group containing at least one nitrogen atom, preferably a heteroaryl group of 1, 2 or 3 nitrogen atoms and 2-9 carbon atoms, optionally imidazole, a triazole, pyridine, pyrimidine, pyrazine, quinolone or isoquinoline. Ar$^6$ and/or Het may each independently be unsubstituted or substituted with one or more substituents, optionally one or more substituents selected from R$^3$ as described above.

Preferably, y is 0. More preferably, x is 2 or 3 and y is 0.

In some embodiments, x is 2, y is 0 and M is Pt$^{2+}$.

In some embodiments, x is 3, y is 0 and M is Ir$^{3+}$.

Exemplary ligands A-Ar$^1$ of formula (Ia) are:

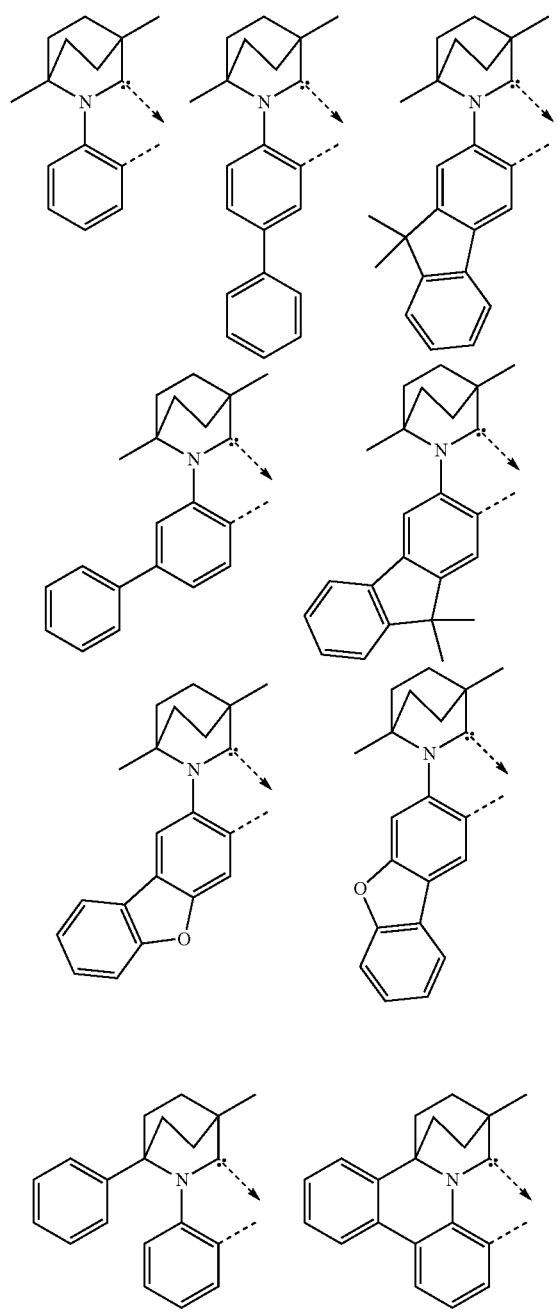
Exemplary ligands A-Ar¹ of formula (Ib) are:
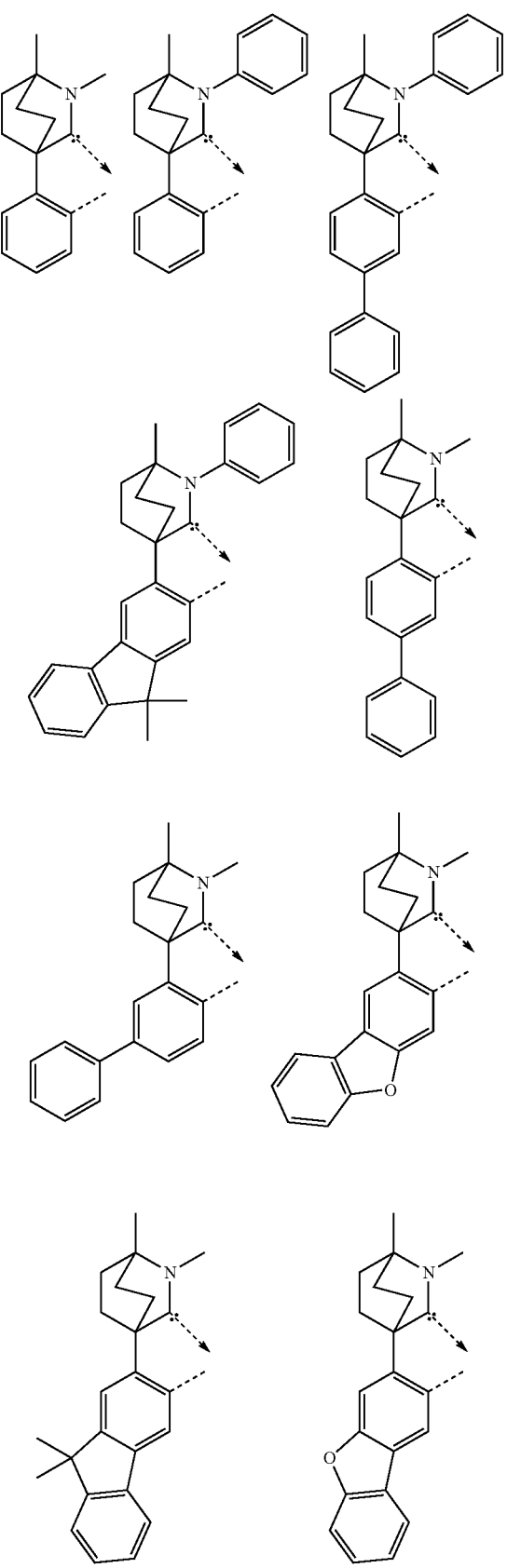

-continued

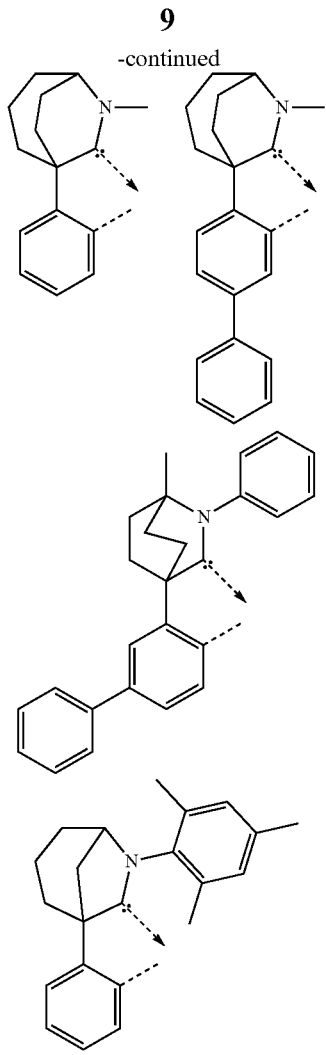

Exemplary ligands of formula A-Ar¹ wherein A is a tricyclic group are:

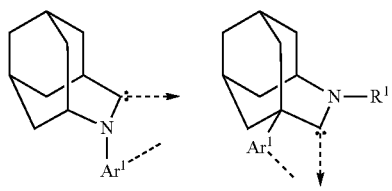

In use, the compound of formula (I) is preferably combined with a host material having a HOMO level deeper (further from vacuum level) than that of the compound of formula (I).

Compounds of formula (I) preferably have a photoluminescence spectrum with a peak of no more than 500 nm, preferably in the range of 400-500 nm, optionally 420-490 nm.

The photoluminescence spectrum of a light-emitting compound as described herein may be measured by casting 5 wt % of the material in a PMMA film onto a quartz substrate to achieve transmittance values of 0.3-0.4 and measuring in a nitrogen environment using apparatus C9920-02 supplied by Hamamatsu.

Host Material

The host material has a triplet excited state energy level Ti that is no more than 0.1 eV lower than, and preferably at least the same as or higher than, the phosphorescent compound of formula (I) in order to allow transfer of triplet excitons from the host material to the phosphorescent compound of formula (I).

The triplet excited state energy levels of the host material and the phosphorescent compound may be determined from their respective phosphorescence spectra. The phosphorescence spectrum of a host material may be determined by the energy onset of the phosphorescence spectrum measured by low temperature phosphorescence spectroscopy (Y. V. Romaovskii et al, Physical Review Letters, 2000, 85 (5), p 1027, A. van Dijken et al, Journal of the American Chemical Society, 2004, 126, p 7718).

Preferably, the host material has a LUMO of no more than 2.2 eV, optionally no more than 2.0 eV from vacuum level.

Preferably, the host material has a LUMO that is deeper (further from vacuum level) than that of the compound of formula (I).

The host material may be a polymer or a non-polymeric compound.

An exemplary non-polymeric host material is an optionally substituted compound of formula (II) or (III):

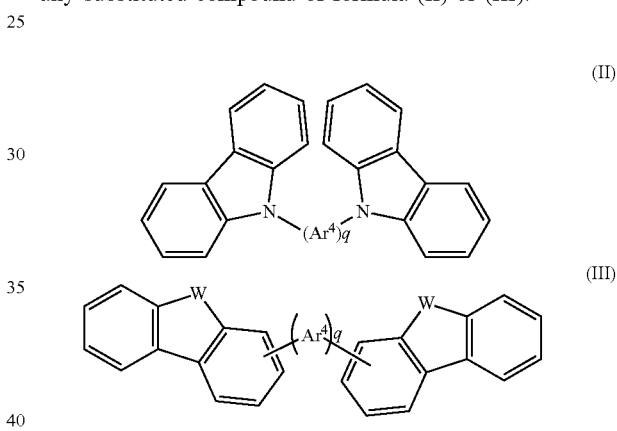

wherein Ar⁴ is a $C_{6-20}$ aromatic group or 5-20 membered heteroaromatic group which is unsubstituted or substituted with one or more substituents; q is at least 1, optionally 1, 2 or 3; and W is O or S.

Optionally, $-(Ar^4)_q-$ is selected from the group consisting of 1,4-phenylene; 1,3-phenylene; 4,4'-biphenylene; 2,8-dibenzothiophene; and 2,8-dibenzothiophene;

Each of the benzene rings and aromatic carbon atoms of the compound of formula (II) or (III) may independently be unsubstituted or substituted with one or more substituents.

Substituents may be selected from $C_{1-20}$ alkyl wherein one or more non-adjacent, non-terminal C atoms of the alkyl may be replaced with O, S, COO, C=O or $Si(R^9)_2$ and one or more H atoms of the $C_{1-20}$ alkyl may be replaced with F, wherein the groups $R^9$ are the same or different and are selected from $C_{1-12}$ alkyl, unsubstituted phenyl, and phenyl substituted with one or more $C_{1-12}$ alkyl groups.

The compound of formula (I) may be mixed with the host material or may be covalently bound to the host material. In the case where the host material is a polymer, the compound of formula (I) may be provided as a main chain repeat unit, a side group of a repeat unit, or an end group of the polymer.

In the case where the compound of formula (I) is provided as a side group, it may be directly bound to a main chain of the polymer or spaced apart from the main chain by a spacer group. Exemplary spacer groups include $C_{1-20}$ alkyl groups, aryl-$C_{1-20}$ alkyl groups and $C_{1-20}$ alkoxy groups. The polymer main chain or spacer group may be bound to a ligand A-$Ar^1$ or (if present) another ligand L.

If the compound of formula (I) is bound to a polymer comprising conjugated repeat units then it may be bound to the polymer such that there is no conjugation between it and the conjugated repeat units, or such that the extent of conjugation between it and the conjugated repeat units is limited.

If the compound of formula (I) is mixed with a host material then the host:emitter weight ratio is optionally in the range of 50-99.5:50-0.5.

If the compound of formula (I) is bound to a polymer then repeat units or end groups containing a compound of formula (I) may form 0.5-20 mol percent, more preferably 1-10 mol percent of the repeat units of the polymer.

Exemplary host polymers include polymers having a non-conjugated backbone with charge-transporting groups pendant from the non-conjugated backbone, for example poly(9-vinylcarbazole), and polymers comprising conjugated repeat units in the backbone of the polymer. If the backbone of the polymer comprises conjugated repeat units then the extent of conjugation between repeat units in the polymer backbone may be limited in order to maintain a triplet energy level of the polymer that is no lower than that of the phosphorescent compound of formula (I).

Exemplary repeat units of a conjugated polymer include unsubstituted or substituted monocyclic and polycyclic heteroarylene repeat units and unsubstituted or substituted monocyclic and polycyclic arylene repeat units as disclosed in for example, Adv. Mater. 2000 12(23) 1737-1750 and include: 1,2-, 1,3- and 1,4-phenylene repeat units, for example as disclosed in J. Appl. Phys. 1996, 79, 934; 2,7-fluorene repeat units, for example as disclosed in EP 0842208; indenofluorene repeat units as disclosed in, for example, Macromolecules 2000, 33(6), 2016-2020; spirobifluorene repeat units as disclosed in, for example EP 0707020; triaryltriazine repeat units, optionally triphenyltriazine repeat units; dibenzofuran repeat units; and dibenzothiophene repeat unit.

Each of these repeat units is unsubstituted or substituted with one or more substituents. Examples of substituents include $C_{1-20}$ alkyl and —$(Ar^5)_p$ wherein $Ar^5$ is an aryl or heteroaryl group, preferably phenyl, which is unsubstituted or substituted with one or more substituents, optionally $C_{1-12}$ alkyl; and p is 1, 2 or 3.

Organic Light-Emitting Device

The FIGURE, which is not drawn to any scale, illustrates schematically an OLED 100 according to an embodiment of the invention. The OLED 100 is carried on substrate 107 and comprises an anode 101, a cathode 105 and a light-emitting layer 103 between the anode and the cathode. Further layers (not shown) may be provided between the anode and the cathode including, without limitation, hole-transporting layers, electron-transporting layers, hole-blocking layers, electron-blocking layers, hole-injection layers and electron-injection layers.

Exemplary OLED structures including one or more further layers include the following:
Anode/Hole-injection layer/Light-emitting layer/Cathode
Anode/Hole transporting layer/Light-emitting layer/Cathode
Anode/Hole-injection layer/Hole-transporting layer/Light-emitting layer/Cathode
Anode/Hole-injection layer/Hole-transporting layer/Light-emitting layer/Electron-transporting layer/Cathode.

Light-emitting layer 103 contains a phosphorescent compound of formula (I).

Light-emitting layer 103 may further comprise a host material. The device may contain more than one light-emitting layer. The light-emitting layer or layers may contain the phosphorescent compound of formula (I) and one or more further light-emitting compounds, for example further phosphorescent or fluorescent light-emitting materials having a colour of emission differing from that of the compound of formula (I). Optionally, the device comprises a hole-transporting layer and a further light-emitting material is provided in one or both of the hole-transporting layer and the light-emitting layer containing the phosphorescent compound of formula (I). Emission from the compound of formula (I) and the further light-emitting compounds may produce white light when the device is in use. Optionally, a light-emitting layer comprising a compound of formula (I) consists essentially of the compound of formula (I), one or more host materials and optionally one or more further light-emitting compounds.

Preferably, light emitted from a composition consisting of a host and a compound of formula (I) is substantially all from the compound of formula (I).

The OLED may be a white OLED containing a blue light-emitting compound of formula (I) and one or more further light-emitting materials having a colour of emission such that light emitted from the device is white. Further light-emitting materials include red and green light-emitting materials that may be fluorescent or phosphorescent. Optionally, all light emitted from a white OLED is phosphorescence.

The one or more further light-emitting materials may present in the same light-emitting layer as the compound of formula (I) or may be provided in one or more further light-emitting layers of the device. In one optional arrangement an OLED comprises a red light-emitting layer and a green and blue light-emitting layer. Optionally, the red layer is a hole-transporting layer that is adjacent to the green and blue light-emitting layer.

The light emitted from a white OLED may have a correlated colour temperature (CCT) in the range of 2500-9000K, more preferably 2700-6000K, and a Duv of less than 0.02, preferably less than 0.01.

A green emitting material may have a photoluminescent spectrum with a peak in the range of more than 500 nm up to 580 nm, optionally more than 500 nm up to 540 nm A red emitting material may optionally have a peak in its photoluminescent spectrum of more than 580 nm up to 630 nm, optionally 585 nm up to 625 nm.

Charge Transporting and Charge Blocking Layers

A hole transporting layer may be provided between the anode and the light-emitting layer or layers. Likewise, an electron transporting layer may be provided between the cathode and the light-emitting layer or layers.

An electron blocking layer may be provided between the anode and the light-emitting layer and a hole blocking layer may be provided between the cathode and the light-emitting layer. Transporting and blocking layers may be used in combination. Depending on its HOMO and LUMO levels, a single layer may both transport one of holes and electrons and block the other of holes and electrons.

A charge-transporting layer or charge-blocking layer may be crosslinked, particularly if a layer overlying that charge-transporting or charge-blocking layer is deposited from a solution. The crosslinkable group used for this crosslinking may be a crosslinkable group comprising a reactive double bond such and a vinyl or acrylate group, or a benzocyclobutane group. The crosslinkable group may be provided as a substituent pendant from the backbone of a charge-transporting or charge-blocking polymer. Following formation of a charge-transporting or charge blocking layer, the crosslinkable group may be crosslinked by thermal treatment or irradiation.

If present, a hole transporting layer located between the anode and the light-emitting layers preferably has a HOMO level of less than or equal to 5.5 eV, more preferably around 4.8-5.5 eV as measured by square wave voltammetry. The HOMO level of the hole transport layer may be selected so as to be within 0.2 eV, optionally within 0.1 eV, of a material of an adjacent layer (preferably a light-emitting layer) in order to provide a small barrier to hole transport between these layers.

If present, an electron transporting layer located between the light-emitting layers and cathode preferably has a LUMO level of around 2.5-3.5 eV as measured by square wave voltammetry.

If present, a hole-blocking layer may comprise or consist of a compound of formula (III):

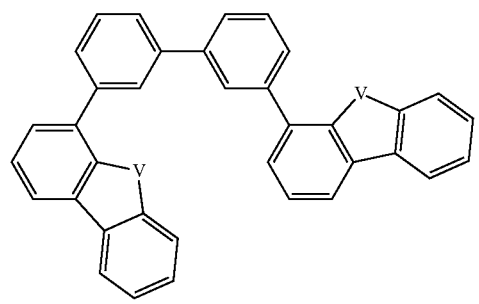

(III)

wherein V in each occurrence is independently S or O, preferably S. The compound of formula (III) may be unsubstituted or may be substituted with one or more substituents, optionally one or more $C_{1-40}$ hydrocarbyl groups, optionally one or more $C_{1-20}$ alkyl groups.

A hole transporting layer may contain a hole-transporting (hetero)arylamine, preferably a homopolymer or copolymer comprising arylamine repeat units as disclosed in, for example, WO 99/54385 or WO 2005/049546, the contents of which are incorporated herein by reference. Exemplary copolymers comprise repeat amine repeat units and optionally substituted (hetero)arylene co-repeat units, such as phenyl, fluorene or indenofluorene repeat units, wherein each of said (hetero)arylene repeat units may optionally be substituted with one or more substituents such as alkyl or alkoxy groups.

An electron transporting layer may contain a polymer comprising a chain of optionally substituted arylene repeat units, such as a chain of fluorene repeat units.

Hole Injection Layers

A conductive hole injection layer, which may be formed from a conductive organic or inorganic material, may be provided between the anode and the light-emitting layer or layers to assist hole injection from the anode into the layer or layers of semiconducting polymer. A hole transporting layer may be used in combination with a hole injection layer. Examples of doped organic hole injection materials include optionally substituted, doped poly(ethylene dioxythiophene) (PEDT), in particular PEDT doped with a charge-balancing polyacid such as polystyrene sulfonate (PSS) as disclosed in EP 0901176 and EP 0947123, polyacrylic acid or a fluorinated sulfonic acid, for example Nafion®; polyaniline as disclosed in U.S. Pat. Nos. 5,723,873 and 5,798,170; and optionally substituted polythiophene or poly(thienothiophene). Examples of conductive inorganic materials include transition metal oxides such as VOx, MoOx and RuOx as disclosed in Journal of Physics D: Applied Physics (1996), 29(11), 2750-2753.

Cathode

The cathode comprises at least one layer of conductive material, preferably a material having a work function of at least 4.0 eV such as aluminium or silver.

The cathode may contain a thin (e.g. 0.5-5 nm thick) layer of metal compound between the light-emitting layer(s) of the OLED and the one or more conductive layers of the cathode, such as one or more metal layers. Exemplary metal compounds include an oxide or fluoride of an alkali or alkali earth metal, for example lithium fluoride as disclosed in WO 00/48258; barium fluoride as disclosed in Appl. Phys. Lett. 2001, 79(5), 2001; and barium oxide. The cathode may be a bilayer of a conductive layer and a metal compound between the conductive layer and the light-emitting layer. The cathode may directly contact the light-emitting layer or may be spaced apart therefrom by one or more layers such as an electron-transporting layer or hole-blocking layer.

The cathode may be opaque or transparent. Transparent cathodes are particularly advantageous for active matrix devices because emission through a transparent anode in such devices is at least partially blocked by drive circuitry located underneath the emissive pixels. A transparent cathode comprises a layer of a transparent conducting material such as indium tin oxide.

Encapsulation

The substrate preferably has good barrier properties for prevention of ingress of moisture and oxygen into the device. The substrate is commonly glass, however alternative substrates may be used, in particular where flexibility of the device is desirable. For example, the substrate may comprise a plastic as in U.S. Pat. No. 6,268,695 which discloses a substrate of alternating plastic and barrier layers or a laminate of thin glass and plastic as disclosed in EP 0949850.

The device may be encapsulated with an encapsulant (not shown) to prevent ingress of moisture and oxygen. Suitable encapsulants include a sheet of glass, films having suitable barrier properties such as silicon dioxide, silicon monoxide, silicon nitride or alternating stacks of polymer and dielectric as disclosed in, for example, WO 01/81649 or an airtight container as disclosed in, for example, WO 01/19142. In the case of a transparent cathode device, a transparent encapsulating layer such as silicon monoxide or silicon dioxide may be deposited to micron levels of thickness, although in one preferred embodiment the thickness of such a layer is in the range of 20-300 nm. A getter material for absorption of any atmospheric moisture and/or oxygen that may permeate through the substrate or encapsulant may be disposed between the substrate and the encapsulant.

Compound Processing

The compound of formula (I) may be deposited on a surface by any suitable process including, without limitation, evaporation and deposition from a formulation comprising one or more solvents and the compound of formula (I) dissolved or dispersed, preferably dissolved, therein.

Exemplary solution deposition techniques for forming a light-emitting layer containing a compound of formula (I) include printing and coating techniques such as spin-coating, dip-coating, roll-to-roll coating or roll-to-roll printing, doctor blade coating, slot die coating, gravure printing, screen printing and inkjet printing.

Coating methods, such as those described above, are particularly suitable for devices wherein patterning of the light-emitting layer or layers is unnecessary—for example for lighting applications or simple monochrome segmented displays.

Printing is particularly suitable for high information content displays, in particular full colour displays. A device may be inkjet printed by providing a patterned layer over the first electrode and defining wells for printing of one colour (in the case of a monochrome device) or multiple colours (in the case of a multicolour, in particular full colour device). The patterned layer is typically a layer of photoresist that is patterned to define wells as described in, for example, EP 0880303.

As an alternative to wells, the ink may be printed into channels defined within a patterned layer. In particular, the photoresist may be patterned to form channels which, unlike wells, extend over a plurality of pixels and which may be closed or open at the channel ends.

The same coating and printing methods may be used to form other layers of an OLED including (where present) a hole injection layer, a charge transporting layer and a charge blocking layer.

A formulation comprising the compound of formula (I) preferably comprises a solvent selected from mono- or poly-alkylbenzene, such as toluene or xylene; mono- or poly-alkoxybenzenes; and mixtures thereof. The formulation may comprise one or more solvents.

The formulation may comprise the compound of formula (I) dissolved in the solvent or solvents and, optionally, one or more further materials dissolved or dispersed, preferably dissolved, in the solvent or solvents.

The one or more further materials may comprise or consist of one or more of a host material and one or more further light-emitting materials.

Examples

Measurements

Unless stated otherwise, HOMO and LUMO energy levels as described anywhere herein are as measured by square wave voltammetry.
Equipment:
CHI660D Electrochemical workstation with software (IJ Cambria Scientific Ltd))
CHI 104 3 mm Glassy Carbon Disk Working Electrode (IJ Cambria Scientific Ltd))
Platinum wire auxiliary electrode
Reference Electrode (Ag/AgCl) (Havard Apparatus Ltd)
Chemicals
Acetonitrile (Hi-dry anhydrous grade—ROMIL) (Cell solution solvent)
Toluene (Hi-dry anhydrous grade) (Sample preparation solvent)
Ferrocene—FLUKA (Reference standard)
Tetrabutylammoniumhexafluorophosphate—FLUKA) (Cell solution salt)
Sample Preparation
The sample is measured as a dilute solution (0.3 w %) in a suitable solvent, e.g. toluene.
Electrochemical Cell The measurement cell contains the electrolyte, a glassy carbon working electrode, a platinum counter electrode, and a Ag/AgCl reference glass electrode. Ferrocene is added into the cell at the end of the experiment as reference material (LUMO (ferrocene)=−4.8 eV).

Formula (Ia) Synthesis

A compound of formula (Ia) may be prepared according to Scheme 1.

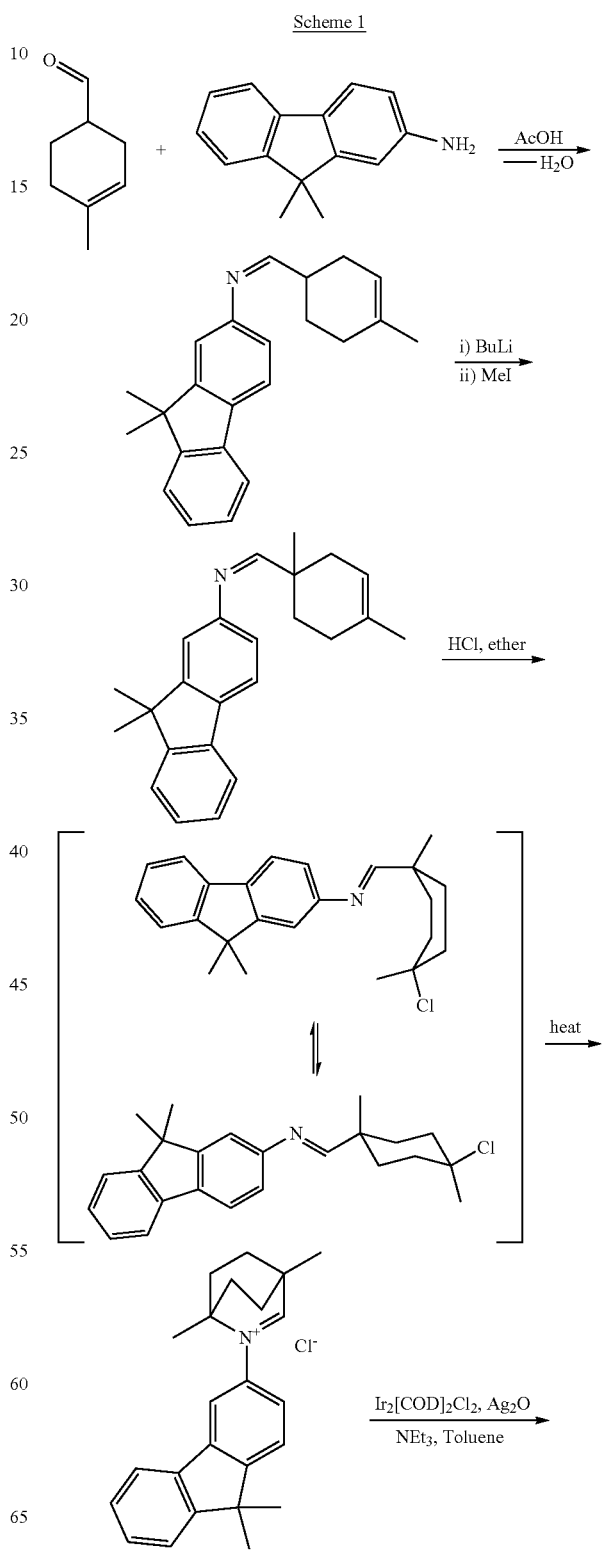

-continued
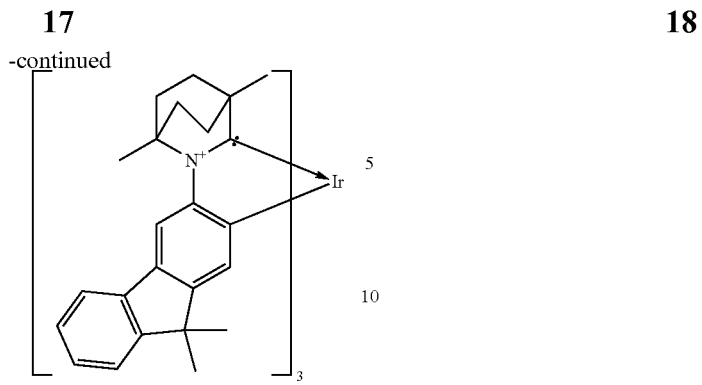
Formula (Ib) Synthesis
A compound of formula (Ib) may be prepared according to Scheme 2.
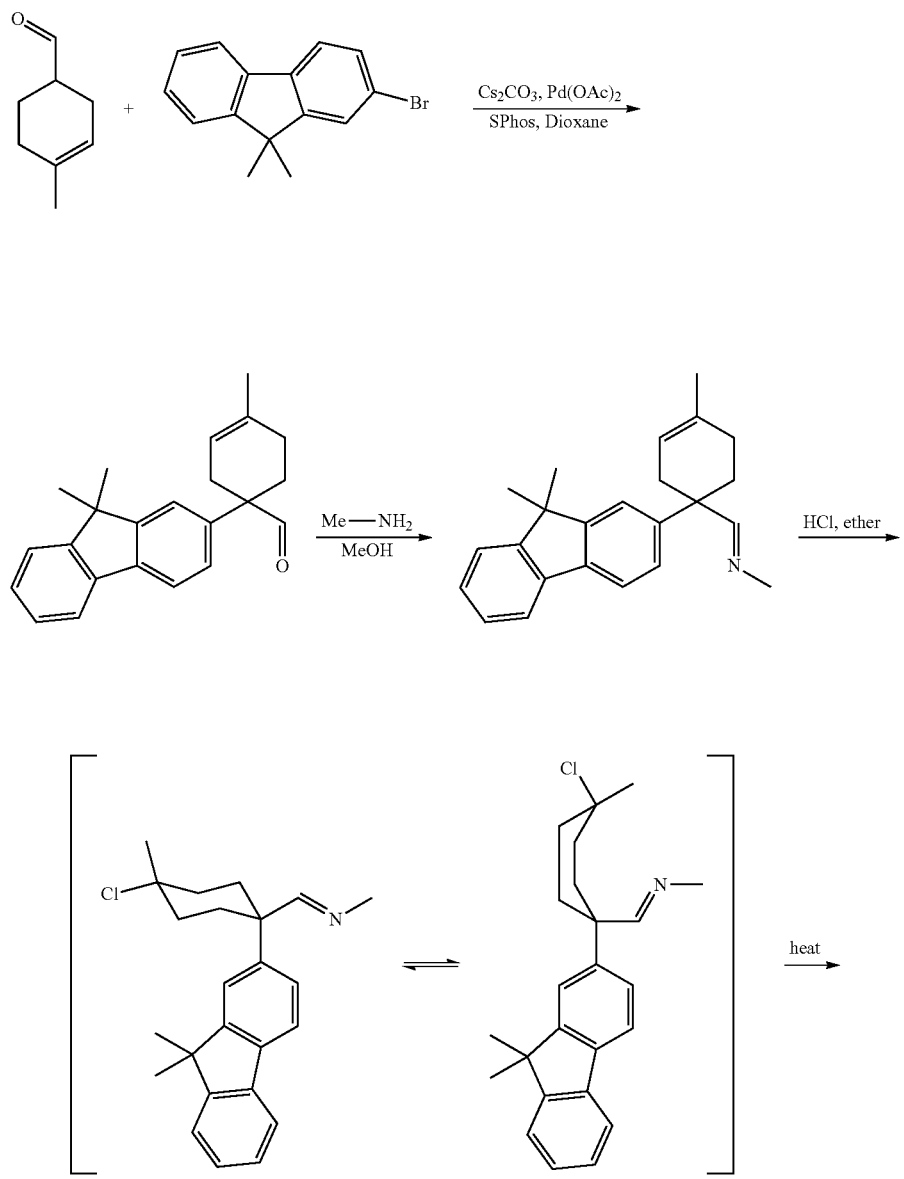

-continued

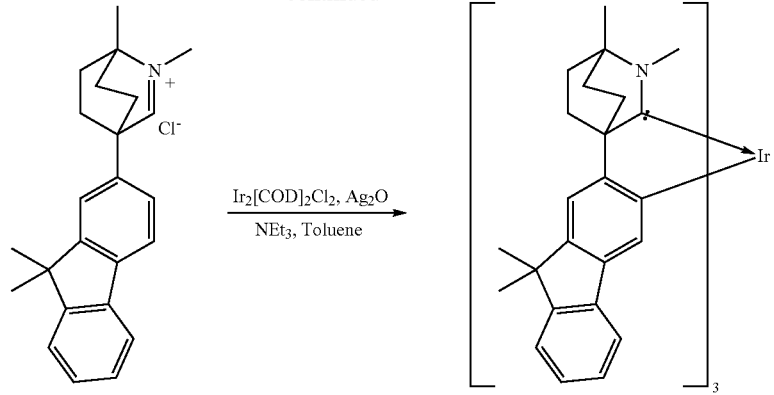

Modelling Data

HOMO, LUMO and lowest triplet excited state ($T^1$) energy levels of compounds of formulae (Ia) and (Ib) and comparative compounds were modelled and the results are provided in Table 1.

Quantum chemical modelling was performed using Gaussian09 software available from Gaussian using Gaussian09 with B3LYP (functional) and LACVP* (Basis set).

| Compound | Structure | HOMO (eV) | LUMO (eV) | Triplet energy (eV) | Corresponding Phosphorescent Emission Wavelength (nm) |
|---|---|---|---|---|---|
| Comparative Compound 1 | Ir(pmb)$_3$ | −4.87 | −0.57 | 3.34 | 372 |
| Comparative Compound 2 |  | −4.96 | −1.31 | 2.90 | 428 |
| Comparative Compound 3 |  | −5.26 | −1.78 | 2.68 | 462 |

-continued

| Compound | Structure | HOMO (eV) | LUMO (eV) | Triplet energy (eV) | Corresponding Phosphorescent Emission Wavelength (nm) |
|---|---|---|---|---|---|
| Comparative Compound 4 | | −5.05 | −1.63 | 2.64 | 470 |
| Compound Example 1 | | −4.65 | −0.47 | 2.93 | 423 |
| Compound Example 2 | | −4.70 | −0.72 | 2.80 | 443 |
| Compound Example 3 | | −4.60 | −0.75 | 2.66 | 466 |

-continued

| Compound | Structure | HOMO (eV) | LUMO (eV) | Triplet energy (eV) | Corresponding Phosphorescent Emission Wavelength (nm) |
|---|---|---|---|---|---|
| Compound Example 4 | | −4.73 | −0.64 | 2.87 | 431 |
| Compound Example 5 | | −4.61 | −0.60 | 2.80 | 443 |
| Compound Example 5 | | −4.77 | −0.67 | 2.93 | 422 |
| Compound Example 6 | | −4.74 | −0.91 | 2.72 | 457 |

-continued

| Compound | Structure | HOMO (eV) | LUMO (eV) | Triplet energy (eV) | Corresponding Phosphorescent Emission Wavelength (nm) |
| --- | --- | --- | --- | --- | --- |
| Compound Example 7 | | −4.66 | −0.50 | 2.92 | 425 |
| Compound Example 8 | | −4.72 | −0.81 | 2.77 | 447 |
| Compound Example 9 | | −4.74 | −0.16 | 3.38 | 367 |
| Compound Example 10 | | −4.83 | −0.30 | 3.20 | 387 |

-continued

| Compound | Structure | HOMO (eV) | LUMO (eV) | Triplet energy (eV) | Corresponding Phosphorescent Emission Wavelength (nm) |
|---|---|---|---|---|---|
| Compound Example 11 | | −4.74 | −0.32 | 3.15 | 393 |
| Compound Example 12 | | −4.76 | −0.43 | 3.08 | 403 |
| Compound Example 13 | | −4.67 | −0.30 | 2.98 | 416 |
| Compound Example 14 | | −4.79 | −0.44 | 3.10 | 400 |

-continued

| Compound | Structure | HOMO (eV) | LUMO (eV) | Triplet energy (eV) | Corresponding Phosphorescent Emission Wavelength (nm) |
|---|---|---|---|---|---|
| Compound Example 15 | | −4.58 | −0.34 | 2.96 | 419 |
| Compound Example 16 | | −4.73 | −0.46 | 2.99 | 415 |
| Compound Example 17 | | −4.89 | −0.14 | 3.50 | 354 |
| Compound Example 18 | | −4.78 | −0.23 | 3.28 | 378 |
| Compound Example 19 | | −4.52 | −0.53 | 2.77 | 447 |

-continued

| Compound | Structure | HOMO (eV) | LUMO (eV) | Triplet energy (eV) | Corresponding Phosphorescent Emission Wavelength (nm) |
|---|---|---|---|---|---|
| Compound Example 20 | | −4.85 | −0.38 | 3.64 | 388 |
| Compound Example 21 | | −4.69 | −0.39 | 2.97 | 418 |
| Compound Example 22 | | −4.69 | −0.16 | 3.35 | 370 |

Although the present invention has been described in terms of specific exemplary embodiments, it will be appreciated that various modifications, alterations and/or combinations of features disclosed herein will be apparent to those skilled in the art without departing from the scope of the invention as set forth in the following claims.

The invention claimed is:

1. A phosphorescent compound of formula (I):

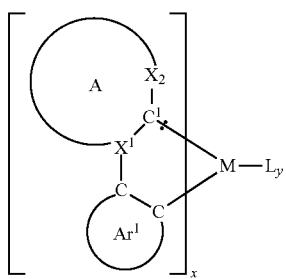

wherein:
M is a transition metal;
$C^1$ is a carbon atom forming a metal-carbene bond with M;
A is a saturated bridged bicyclic or saturated bridged tricyclic group consisting of one nitrogen atom and 6-12 carbon atoms wherein the carbon atoms are each independently unsubstituted or substituted with one or more substituents;
either: (i) $X^1$ is a bridgehead carbon atom of the bridged bicyclic or bridged tricyclic group and $X^2$ is $NR^1$ wherein $R^1$ is a substituent, or
(ii) $X^1$ is N and $X^2$ is a bridgehead group of formula $CR^6$ wherein $R^6$ is H or a substituent;
two substituents selected from substituents of the carbon atoms of A and substituent $R^1$ may be linked to form a ring;
$Ar^1$ is a $C_{6-20}$ aromatic group or a 5-20 membered heteroaromatic group which is unsubstituted or substituted with one or more substituents wherein a substituent of $Ar^1$ and a substituent of A may be linked to form a divalent linking group;
L in each occurrence is independently a mono- or polydentate ligand other than a ligand of formula A-$Ar^1$;
x is at least 1; and
y is 0 or a positive integer.

2. A compound according to claim 1 wherein M is selected from palladium, rhenium, osmium, iridium and platinum.

3. A compound according to claim 1 wherein $R^1$ is a substituent selected from the group consisting of:
$C_{1-20}$ alkyl wherein one or more non-adjacent, non-terminal C atoms of the alkyl group may be replaced with O, S, C=O and —COO—, and wherein one or more H atoms of the $C_{1-20}$ alkyl may be replaced with F: and —$(Ar^2)_w$ wherein $Ar^2$ in each occurrence is independently an aromatic or heteroaromatic group, w is at least 1, and each $Ar^2$ is unsubstituted or substituted with one or more substituents.

4. A compound according to claim 1 wherein $Ar^1$ is selected from the group consisting of phenyl, fluorenyl and dibenzofuran.

5. A compound according to claim 1 wherein A and $Ar^1$ are linked by a divalent linking group.

6. A compound according to claim 1 wherein the compound of formula (I) has formula (Ia):

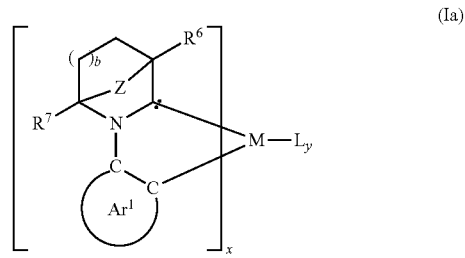

wherein Z is a group of formula —$C(R^4)_2$— or —$C(R^4)_2$—$C(R^4)_2$— wherein $R^4$ in each occurrence is H or a substituent; $R^6$ and $R^7$ are each independently H or a substituent; and b is 1 or 2.

7. A compound according to claim 6 wherein at least one of $R^6$ and $R^7$ is selected from the group consisting of $C_{1-12}$ alkyl; unsubstituted $C_{6-20}$ aryl; and $C_{6-20}$ aryl substituted with one or more substituents.

8. A compound according to claim 6 wherein A-$Ar^1$ is selected from ligands of formula (1), (2), and (3) which are unsubstituted or substituted with one or more substituents:

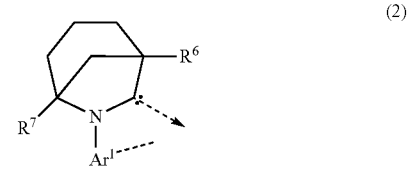

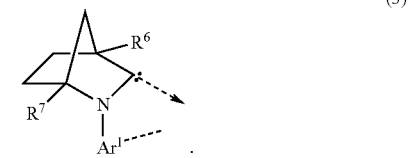

9. A compound according to claim 6 wherein Z is a group of formula —$C(R^4)_2$—$C(R^4)_2$—.

10. A compound according to claim 1 wherein the compound of formula (I) has formula (Ib):

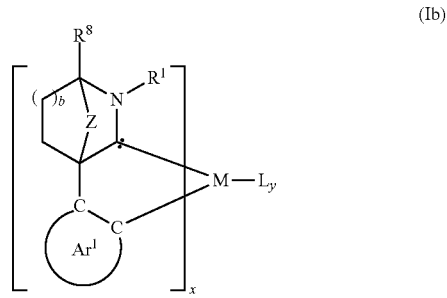

wherein Z is a group of formula —C(R⁴)₂— or —C(R⁴)₂—C(R⁴)₂— wherein R⁴ in each occurrence is H or a substituent; b is 1 or 2; and R⁸ is H or a substituent.

11. A compound according to claim 10 wherein $R^8$ is selected from the group consisting of $C_{1-12}$ alkyl; unsubstituted $C_{6-20}$ aryl; and $C_{6-20}$ aryl substituted with one or more substituents.

12. A compound according to claim 10 wherein A-Ar¹ is selected from ligands of formulae (4) and (5) which are unsubstituted or substituted with one or more substituents:

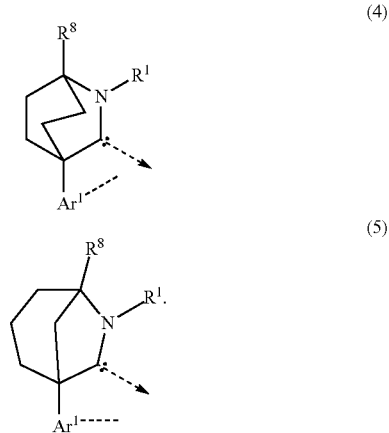

13. A compound according to claim 1 wherein y is 0.

14. A compound according to claim 1 wherein x is 3.

15. A compound according to claim 1 wherein the compound has a photoluminescent spectrum having a peak wavelength in the range of 400-490 nm.

16. A composition comprising a host material and a compound according to claim 1.

17. A formulation comprising a compound according to claim 1 dissolved or dispersed in one or more solvents.

18. An organic light-emitting device comprising an anode, a cathode and a light-emitting layer between the anode and cathode wherein the light-emitting layer comprises a compound according to claim 1.

19. An organic light-emitting device according to claim 18 wherein the device emits white light.

20. A method of forming an organic light-emitting device according to claim 18 comprising the step of depositing the light-emitting layer over one of the anode and cathode, and depositing the other of the anode and cathode over the light-emitting layer, wherein the light-emitting layer is formed by depositing a formulation comprising the compound dissolved or dispersed in one or more solvents and evaporating the one or more solvents.

21. A compound according to claim 1 wherein A is a saturated bridged bicyclic or saturated bridged tricyclic group consisting of one nitrogen atom and 7-12 carbon atoms wherein the carbon atoms are each independently unsubstituted or substituted with one or more substituents.

* * * * *